US007558077B2

(12) United States Patent  (10) Patent No.: US 7,558,077 B2
Awamura  (45) Date of Patent: Jul. 7, 2009

(54) ELECTRONIC DEVICE

(75) Inventor: Ryuji Awamura, Kurate-gun (JP)

(73) Assignee: Hosiden Corporation, Yao-shi (JP)

( * ) Notice: Subject to any disclaimer, the term of this patent is extended or adjusted under 35 U.S.C. 154(b) by 337 days.

(21) Appl. No.: 11/447,864

(22) Filed: Jun. 7, 2006

(65) Prior Publication Data

US 2006/0291678 A1  Dec. 28, 2006

(30) Foreign Application Priority Data

Jun. 23, 2005 (JP) .............................. 2005-184084

(51) Int. Cl.
    *H05K 7/04* (2006.01)
(52) U.S. Cl. ...................... 361/811; 174/260
(58) Field of Classification Search ................ 361/811, 361/807; 381/191; 174/260
    See application file for complete search history.

(56) References Cited

U.S. PATENT DOCUMENTS

| | | | | |
|---|---|---|---|---|
| 5,519,580 | A * | 5/1996 | Natarajan et al. | 361/760 |
| 6,229,249 | B1 | 5/2001 | Hatanaka et al. | 310/348 |
| 6,274,955 | B1 * | 8/2001 | Satoh et al. | 310/71 |
| 6,664,624 | B2 * | 12/2003 | Haematsu | 257/700 |
| 6,693,243 | B1 * | 2/2004 | Oida et al. | 174/260 |
| 6,730,858 | B2 * | 5/2004 | Gotoh et al. | 174/260 |
| 7,260,230 | B2 * | 8/2007 | Feng | 381/174 |
| 2004/0027811 | A1 * | 2/2004 | Onitsuka et al. | 361/749 |
| 2004/0217673 | A1 * | 11/2004 | Unno et al. | 310/348 |
| 2006/0205244 | A1 * | 9/2006 | Shigeno et al. | 439/67 |

FOREIGN PATENT DOCUMENTS

| | | |
|---|---|---|
| EP | 0 893 946 A2 | 1/1999 |
| EP | 0 921 715 A1 | 6/1999 |
| EP | 1 016 467 A2 | 7/2000 |
| EP | 1 104 225 A1 | 5/2001 |
| EP | 1 530 401 A2 | 5/2005 |
| JP | 5-3400 | 1/1993 |
| JP | 05-003400 | 1/1993 |
| JP | 10-012981 | 1/1998 |

OTHER PUBLICATIONS

European Search Report dated Nov. 14, 2007.

* cited by examiner

*Primary Examiner*—Dean A. Reichard
*Assistant Examiner*—Yuriy Semenenko
(74) *Attorney, Agent, or Firm*—Kratz, Quintos & Hanson, LLP

(57) ABSTRACT

An electronic device which enables easily providing a mounting orientation recognition mark thereon while being provided with, on a end surface thereof, input/output terminals surrounded by a ground pattern. A substrate is provided within a case main body. A ground is formed on the surface of the substrate. An output terminal, a power terminal, a clock terminal, a GND terminal and a mounting orientation recognition mark hole have been formed on the ground through pattern removal. The main portion of the substrate is exposed through an opening in the case and the tip end portions of the output terminal and the like are slightly protruded from the end surface of the case main body. The ground pattern on the substrate, the case main body and the like are electrically connected to the GND terminal and the entire component is shielded.

18 Claims, 7 Drawing Sheets (a)

(b)

(a)

(b)

(a)

(b)

ELECTRONIC DEVICE

The present application claims priority under 35 U.S.C. § 119 of Japanese Patent Application No. JP 2005-184084 filed on Jun. 23, 2005, the disclosure of which is expressly incorporated by reference herein in its entity.

BACKGROUND OF THE INVENTION

1. Field of the Invention

The present invention relates to an electronic device, such as an electret condenser microphone, including, on the outer surface, a mounting orientation recognition mark required for automatic mounting onto a printed-circuit board or the like in an electronic apparatus.

2. Description of the Related Art

Along with the size reduction of small-size information communication apparatuses such as cellular phones and PDAs, and electronic apparatuses such as digital still cameras and digital video cameras, printed-circuit boards mounted in these electronic apparatuses have been also miniaturized, thereby increasing the density of electronic devices which are automatically mounted onto the printed-circuit boards. Some electronic devices to be automatically mounted are required to be mounted onto a printed-circuit board such that the orientations thereof, as well as the positions, are in agreement with the printed-circuit board, due to the contour configurations. In many cases, such electronic devices are provided, on the outer surfaces, with mounting orientation recognition marks for use in automatic mounting of the components (for example, refer to JP-A No. 5-3400).

However, in the case of the aforementioned prior-art example, such mounting orientation recognition marks are generally provided on the outer surfaces of the cases of electronic devices by printing or the like, and therefore, there is a need for specific marking operations during the fabrication processes, which makes it difficult to reduce the cost of the electronic devices. Particularly, some electronic devices such as electret condenser microphones are provided with a plurality of input/output terminals on the outer surfaces which are subjected to image recognition during automatic mounting of the components, wherein these terminals have contour configurations surrounded by ground patterns. Accordingly, there is a small space for a mounting orientation recognition mark to be provided, which makes the marking operations complicated along with the size reduction of components, thereby causing cost increases.

SUMMARY OF THE INVENTION

The present invention is made in view of the aforementioned circumstances, and an object of the present invention is to provide an electronic device which enables easily providing a mounting orientation recognition mark thereon while being provided, on an end surface, with a plurality of input/output terminals and having contour configurations surrounded by a ground pattern.

A first electronic device according to the present invention is an electronic device provided with a plurality of input/output terminals on an end surface thereof and having a cross-sectional circular or polygonal shape, wherein the electronic device comprises a substrate forming a portion of a housing and provided with said input/output terminals on a surface thereof, a ground pattern is formed on the surface of the substrate, and said pattern is provided, on a surface thereof, with a hole as a mounting orientation recognition mark for use in automatic mounting of the component which has been formed through pattern removal.

A second electronic device according to the present invention is an electronic device provided with a plurality of input/output terminals on an end surface thereof and having a cross-sectional circular or polygonal shape, wherein the electronic device comprises a substrate forming a portion of a housing and provided with said input/output terminals on a surface thereof, a ground pattern is formed on the surface of the substrate, and the portions of the ground pattern which are around the input/output terminals are removed to form contour removing holes, and at least one of the contour removing holes is formed to have a shape different from that of the other counter removing holes, in order to utilize the counter removing holes as a whole as a mounting orientation recognition mark.

A third electronic device according to the present invention is an electronic device provided with a plurality of input/output terminals on an end surface thereof and having a cross-sectional circular or polygonal shape, wherein the electronic device comprises a substrate forming a portion of a housing and provided with said input/output terminals on a surface thereof, a ground pattern is formed on the surface of the substrate, and at least one of the input/output terminals is formed to have a cross-sectional shape different from that of the other input/output terminals, in order to utilize the input/output terminals as a whole as a mounting orientation recognition mark.

A fourth electronic device according to the present invention is an electronic device provided with a plurality of input/output terminals on an end surface thereof and having a cross-sectional circular or polygonal shape, wherein the electronic device comprises a substrate forming a portion of a housing and provided with said input/output terminals on a surface thereof, a ground pattern is formed on the surface of the substrate, and at least one of the input/output terminals is provided at an asymmetric position with respect to the axis, in order to utilize the input/output terminals as a whole as a mounting orientation recognition mark.

Preferably, in a case where the ground pattern is extended and connected to a GND terminal, plural arc-shaped holes are formed in the ground pattern around the GND terminal such that the arc-shaped holes are circumferentially spaced apart from one another. Also, in a case where the electronic device includes a case main body made of a metal and the tip end portions of said input/output terminals are protruded through an opening formed through an end surface of the case main body, preferably, the peripheral edge of the opening of the case main body is inwardly folded and crimped over the entire periphery, and a mounting orientation recognition mark is provided on the crimped portion. Further, preferably, the input/output terminals are formed from laminated metal thin layers made of the same material as that of the ground pattern.

As described above, with the electronic device according to the present invention, the mounting orientation recognition mark can be formed together with the ground pattern or the input/output terminals, which can eliminate the necessity of special marking operations for providing a mounting orientation recognition mark. Furthermore, there is no need for providing a specific space for providing the mounting orientation recognition mark, which largely contributes to the reduction of the size and the cost of the component.

With the electronic device according the present invention, the plural arc-shaped holes formed around the GND terminal can be utilized as a mounting orientation recognition mark and the mark can enhance the recognition effect during automatic mounting of the component.

With the electronic device according the present invention, provision of amounting orientation recognition mark on the peripheral edge of the opening of the case main body prior to crimping can be easily attained in view of space and the like, and the mark can enhance the recognition effect during automatic mounting of the component.

With the electronic device according to the present invention, the input/output terminals can be formed together with the ground pattern, thereby further reducing the cost.

DETAILED DESCRIPTION OF THE PREFERRED EMBODIMENTS

Figure 1:
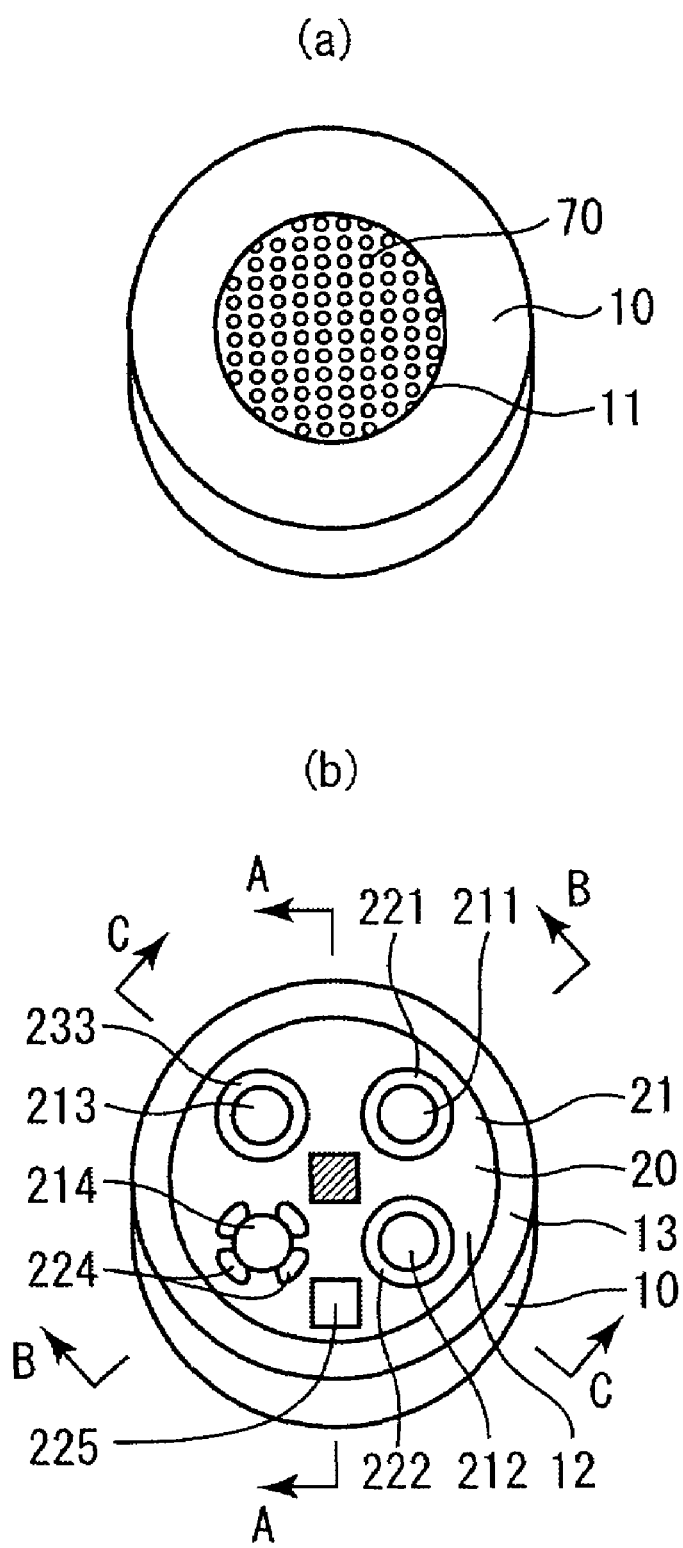
FIG. 1 shows views for illustrating an electronic device according to an embodiment of the present invention, wherein (a) is a front-side perspective view of the same electronic device and (b) is a back-side perspective view of the same electronic device.
Figure 2:
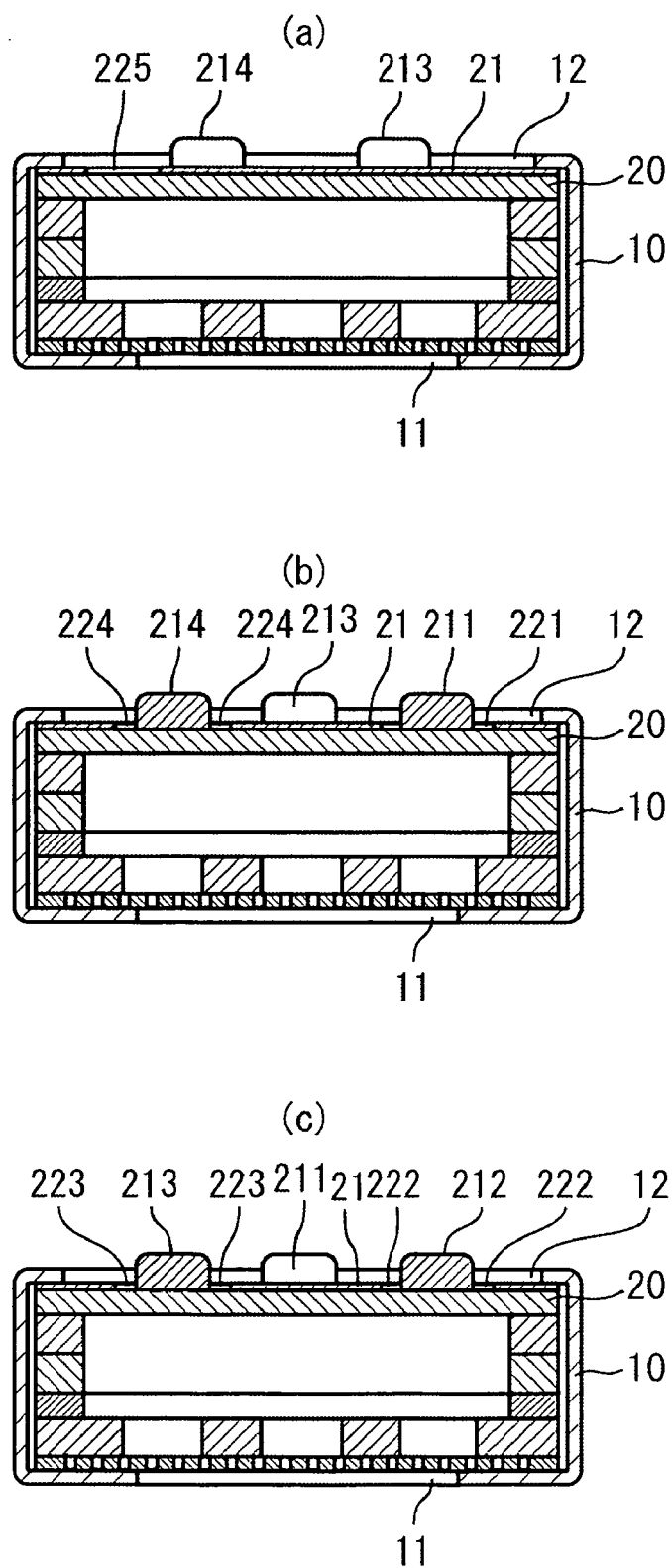
FIGS. 2(a), (b) and (c) show a cross-sectional view taken along the line A-A in FIG. 1, a cross-sectional view taken along the line B-B in FIG. 1 and a cross-sectional view taken along the line C-C in FIG. 1, respectively.
Figure 3:
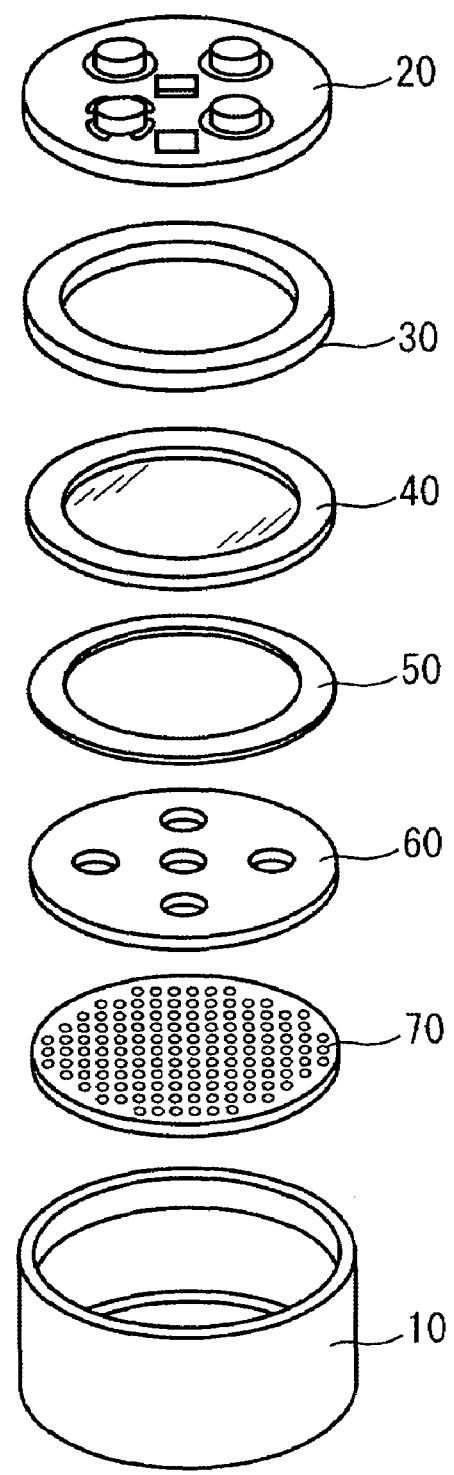
FIG. 3 shows an exploded perspective view of the same electronic device.

Hereinafter, with reference to FIGS. 1 to 3, there will be described an electronic device according to an embodiment of the present invention. FIG. 1 is a front-side perspective view and a back-side perspective view of the same electronic device. FIGS. 2(a), (b) and (c) are a cross-sectional view taken along the line A-A in FIG. 1, a cross-sectional view taken along the line B-B in FIG. 1 and a cross-sectional view taken along the line C-C in FIG. 1. FIG. 3 is an exploded perspective view of the same electronic device.

The electronic device which will be described herein is a digital electret condenser microphone having a cross-sectional circular shape which is used in an electronic apparatus such as a cellular phone. The electronic device is automatically mounted onto a printed-circuit board, not illustrated, which is mounted in the same electronic apparatus. In the figures, 10 is a case main body, 20 is a substrate, 30 is a gate ring, 40 is a vibration plate, 50 is a spacer, 60 is a back plate and 70 is a mesh.

The substrate 20 is a disk-shaped multi-layer printed-circuit board. On the surface of the substrate 20, a main electronic device (not illustrated) which is a microphone is mounted and, on the back surface thereof, a copper ground pattern 21 is formed and also a total of four terminals, which are an output terminal 211, a power terminal 212, a clock terminal 213 and a GND terminal 214, are provided symmetrically with respect to the axis. The output terminal 211, the power terminal 212, the clock terminal 213 and the GND terminal 214 are formed from laminated copper thin layers made of the same material as that of the ground 21.

Contour removing holes 221, 222 and 223 are provided around the output terminal 211, the power terminal 212 and the clock terminal 213 of the ground pattern 21. Further, a total of four arc-shaped holes 224 are provided, with a pitch of 90 degree, around the GND terminal 214. Further, between the power terminal 212 and the GND terminal 214 on the ground pattern 21, there is provided a square-shaped hole 225 as a mounting orientation recognition mark for use in automatic-mounting of the component. The contour removing holes 221, 222 and 223, the arc-shaped holes 224 and the mounting orientation recognition mark hole 225 are formed by pattern-removing the ground pattern 21 through partial etching or the like.

The output terminal 211, the power terminal 212, the clock terminal 213 and the GND terminal 214 are electrically connected to signal lines and power lines (both of which are not illustrated) formed inside and the like of the substrate 20. Further, the ground pattern 21 is partially extended and electrically connected to the GND terminal 214. On the other hand, the output terminal 211, the power terminal 212 and the clock terminal 213 are electrically insulated from the ground pattern 21 through the contour removing holes 221, 222 and 223.

The case main body 10 is a metal cylindrical capsule which is provided with a circular opening 11 (sound hole) through the front end surface and also is provided with a circular opening 12 through the back end surface. Within the case main body 10, there are provided the mesh 70 made of a metal, the back plate 60, the spacer 50, the vibration plate 40, the gate ring 30 and the substrate 20, in the mentioned order, as illustrated in FIG. 3. The peripheral edge of the opening 12 of the case main body 10 is inwardly folded and crimped over the entire periphery thereof. The crimped portion 13 is butted against the ground pattern 21 on the substrate 20 thereby being electrically connected thereto, at the state where it is crimped.

Within the aforementioned case main body 10, the mesh 70, the back plate 60, the spacer 50, the vibration plate 40, the gate ring 30 and the substrate 20 are housed, and the main portions of the mesh 70 and the substrate 20 form a portion of the housing. At this state, the main portion of the mesh 70 is exposed through the opening 11 of the case main body 10. On the other hand, the main portion of the substrate 20 is exposed through the opening 12 of the case 10, and the tip end portions of the output terminal 211, the power terminal 212, the clock terminal 213 and the GND terminal 214 are slightly protruded from the end surface of the case main body 10. Furthermore, the ground pattern 21 on the substrate 20, the case main body 10 and the mesh 70 are electrically connected to the GND terminal 214, and the entire component is shielded.

Further, the basic configuration as an electret condenser microphone is hardly different from conventional configurations and, therefore, the mesh 70, the back plate 60, the spacer 50, the vibration plate 40, the gate ring 30 and the substrate 20 are not described in detail.

The electronic device assembled as described above is transferred to an automated mounting apparatus which is not illustrated, at a state where the electronic device is housed within a hole formed on the surface of a tape of a tape-and-reel unit and is automatically mounted using cream solder onto the aforementioned printed-circuit board at a predetermined position thereof through the same apparatus. During the automatic mounting using the same apparatus, the electronic device is picked up from the same tape using a suction nozzle or the like, then the back surface of the electronic device is photographed by a camera, and the orientation of the electronic device is recognized from the arc-shaped holes 224 and the mounting orientation recognition mark hole 225 included in the photographed image and, based on the result, the orientation of the same electronic device is corrected as required.

In the case of the electronic device having the aforementioned structure, the mounting orientation recognition mark hole 225 and the like are formed together with the ground pattern 21, which eliminates the necessity of specific marking operations unlike the prior-art example. Furthermore, there is no need for providing a specific space for forming the mounting orientation recognition mark, thereby reducing the size and the cost of the electronic device. Further, the output terminal 211, the power terminal 212, the clock terminal 213 and the GND terminal 214 are also formed together with the ground pattern 21, which can also realize cost reduction. Further, the orientation of the electronic device can be recognized from the arc-shaped holes 224 and the mounting orientation recognition mark hole 225, which offers an excellent recognition effect during automatic mounting of the component.

Further, in the aforementioned embodiment, as long as the automated mounting apparatus can recognize the orientation of the electronic device, it is possible to eliminate any of the arc-shaped holes 224 and the mounting orientation recognition mark hole 225. The shape, the number and the like of the hole 225 are not limited, and the hole 225 may be formed at any position on the ground pattern 21 except the center position of the substrate 20. On the other hand, the shape, the number and the like of the arc-shaped holes 224 are not limited as a matter of course and, also, the arc-shaped holes 224 may be eliminated and the GND terminal 214 may be completely connected to the ground pattern 21. The shape of the contour removing holes 221 to 223 also does not matter.

Figure 4:
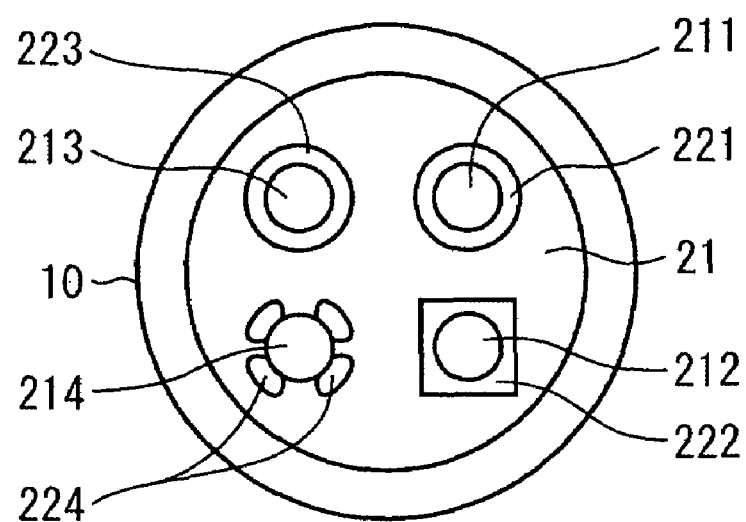
FIG. 4 shows views for illustrating an electronic device according to a first modified example, wherein (a) is a back-side view of the same electronic device and (b) is a back-side view of another electronic device.
Figure 4:
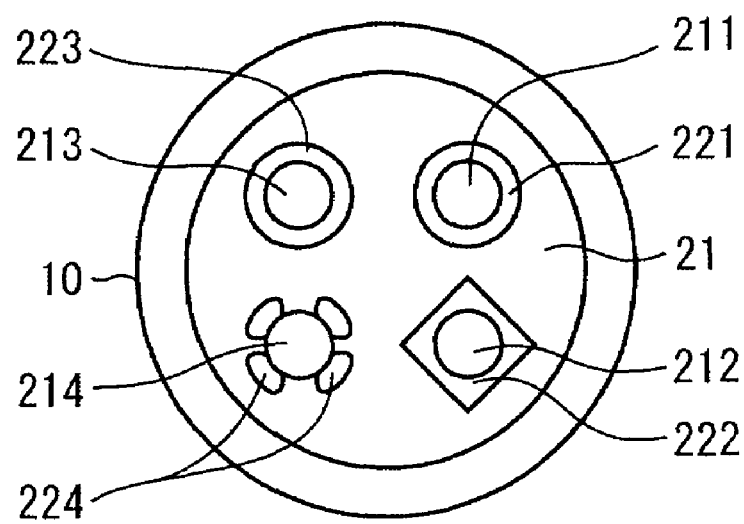

Next, with reference to FIG. 4, there will be described an electronic device according to a first modified example of the aforementioned embodiment. FIGS. 4(a) and 4(b) are back side views of the same electronic device. In the first modified example illustrated in the same figure, the mounting orientation recognition mark hole 225 is eliminated and, instead thereof, the contour removing hole 222, which is formed through the ground pattern 21 around the power terminal 212, has a square shape rather than a circular shape, which is different from the aforementioned embodiment. Further, the other points are completely the same as those in the aforementioned embodiment and, therefore, description and illustration thereof are omitted.

Namely, according to the first modified example, the contour removing hole 222 is formed to have a shape different from that of the counter removing holes 221 and 223 and these holes including the arc-shaped holes 224 as a whole form a mounting orientation recognition mark. The arc-shaped holes 224 and the contour removing holes 221, 222 and 223 are formed together with the ground pattern 21, thereby offering the same effects as those of the aforementioned embodiment.

Further, in the first modified example, any combination, orientation and the like of the contour removing holes 221, 222 and 223 may be selected, as long as all or at least one of the contour removing holes have shapes different from those of the other counter removing shapes. The shape, the number and the like of the arc-shaped holes 224 do not matter as a matter of course and, also, the arc-shaped holes 224 may be eliminated and the GND terminal 214 may be completely connected to the ground pattern 214.

Figure 5:
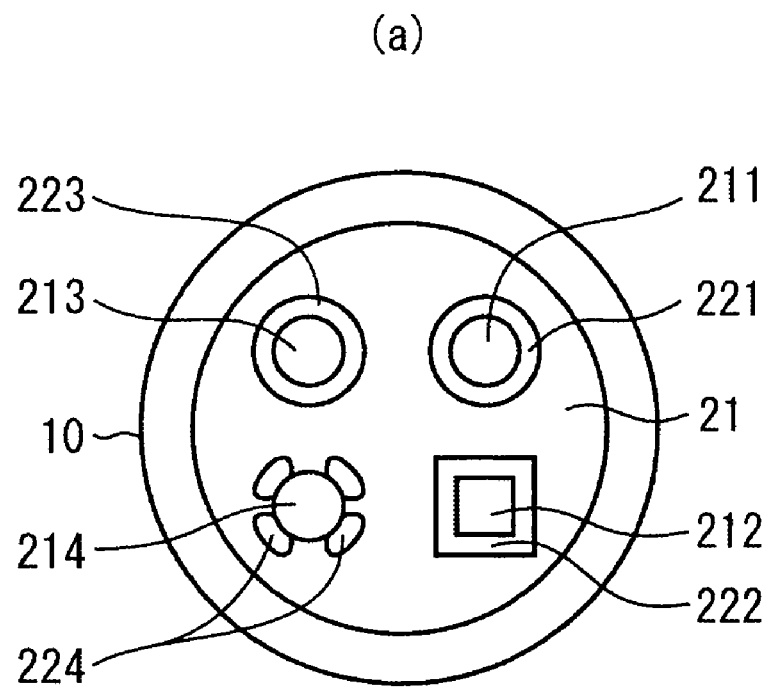
FIG. 5 shows views for illustrating an electronic device according to a second modified example, wherein (a) is a back-side view of the same electronic device and (b) is a back-side view of another electronic device.
Figure 5:
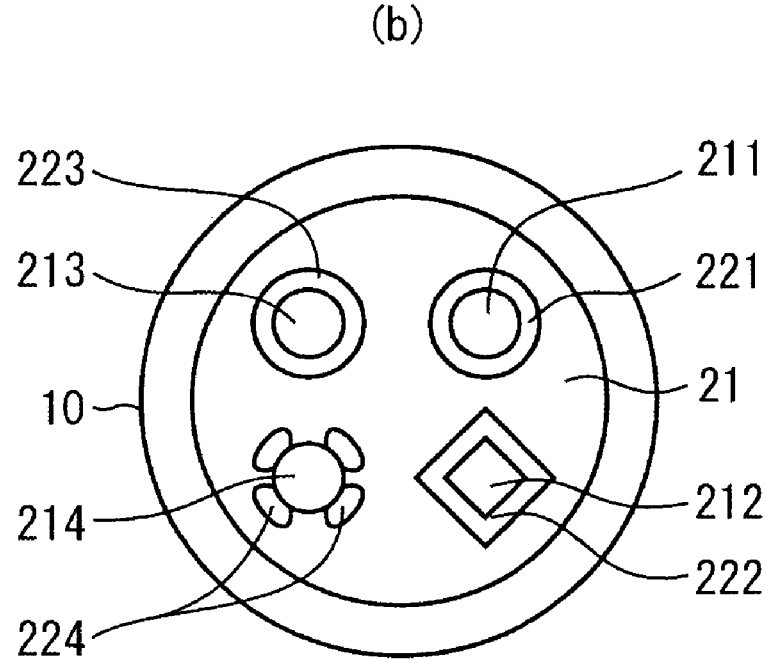

Next, with reference to FIG. 5, there will be described an electronic device according to a second modified example of the aforementioned embodiment. FIGS. 5(a) and (b) are back-side views of the same electronic device. In the second modified example illustrated in the figures, the power terminal 212 is formed to have a cross-sectional square shape rather than a cross-sectional circular shape, which is different from the aforementioned first modified example. Further, the other points are completely the same as those in the aforementioned first example and, therefore, description and illustration thereof are omitted.

Namely, according to the second modified example, the power terminal 212 is formed to have a cross-sectional shape different from those of the output terminal 211, the clock terminal 213 and the GND terminal 214, and these terminals including the arc-shaped holes 224 and the contour removing holes 221, 222 and 223 as a whole form a mounting orientation recognition mark. The power terminal 212 and the like are formed together with the ground pattern 21, thereby offering the same effects as those of the aforementioned embodiment.

Further, in the second modified example, any combination, orientation and the like of the output terminal 211, the power terminal 212, the clock terminal 213 and the GND terminal 214 maybe selected, as long as all or at least one of these terminals have cross-sectional shapes different from those of the other terminals. The shape, the number and the like of the arc-shaped holes 224 do not matter, as a matter of course, and, also, the arc-shaped holes 224 may be eliminated and the GND terminal 214 may be completely connected to the ground pattern 214.

Figure 6:
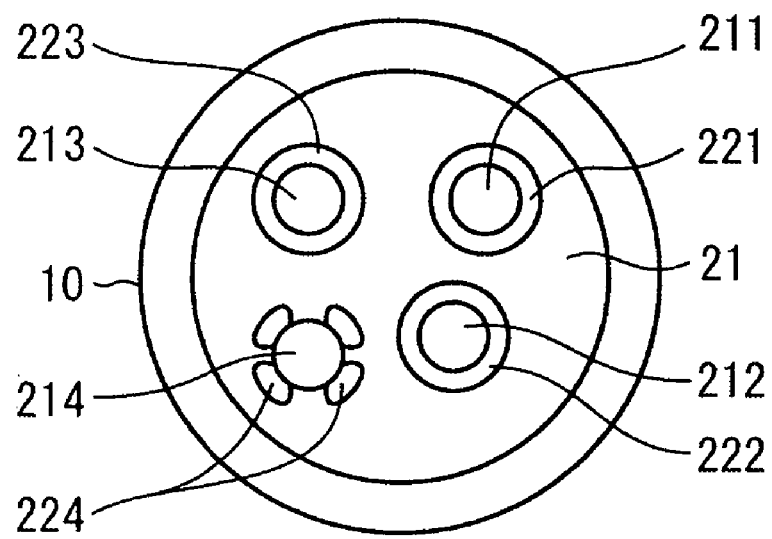
FIG. 6 shows views for illustrating an electronic device according to a third modified example, wherein (a) is a back-side view of the same electronic device and (b) is a back-side view of another electronic device.
Figure 6:
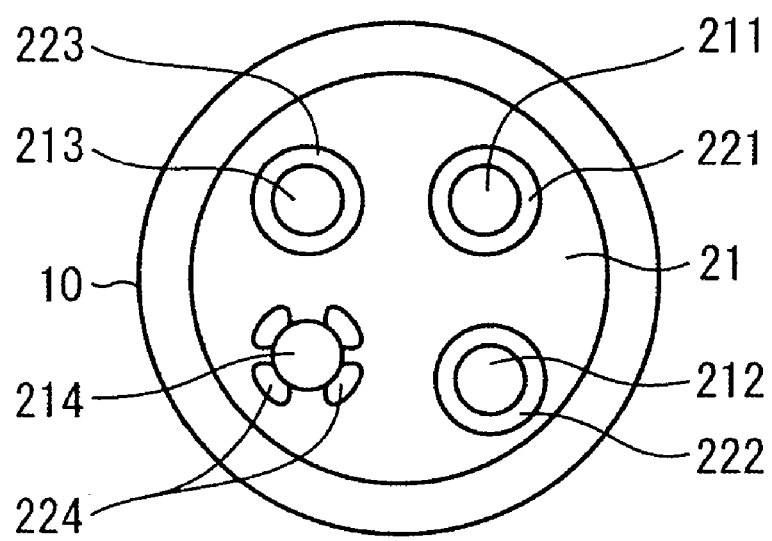

Next, with reference to FIG. 6, there will be described an electronic device according to a third modified example of the aforementioned embodiment. FIGS. 6(a) and (b) are back-side views of the same electronic device. In the third modified example illustrated in the figures, the power terminal 212 is provided on the end surface, at an asymmetrical position with respect to the axis, which is different from the aforementioned embodiment. FIGS. 6(a) and 6(b) illustrate the feature mentioned previously, a circular shape in cross section (which inherently possesses an axis of symmetry, located at the center point, as is known from geometry). FIG. 6(a) also shows that the asymmetrical position of the power terminal 212, stated above, may consist of a distance from the axis different from the distances of the other terminals 211, 213, and 214. This is evident from a comparison of FIG. 6(a) and FIG. 6(b), FIG. 6(b) showing a generally symmetrical arrangement. (The contour removing hole 222 is also located asymmetrically.) Further, the other structures are completely the same as those in the aforementioned embodiment, and description and illustration thereof are omitted.

Namely, according to the third modified example, the power terminal 212 is provided at an asymmetrical position with respect to the axis, unlike the output terminal 211, the clock terminal 213 and the GND terminal 214, and these terminals including the arc-shaped holes 224 as a whole form a mounting orientation recognition mark. The power terminal 212 and the like are formed together with the ground pattern 21, thereby offering the same effects as those of the aforementioned embodiment.

Further, in the third modified example, any combination, orientation, placement and the like of the output terminal 211, the power terminal 212, the clock terminal 213 and the GND terminal 214 may be selected, as long as all or at least one of these terminals are provided at asymmetric positions with respect to the axis. The shape, the number and the like of the arc-shaped holes 224 are not limited as a matter of course and, also, the arc-shaped holes 224 may be eliminated and the GND terminal 214 may be completely connected to the ground pattern 21.

Figure 7:
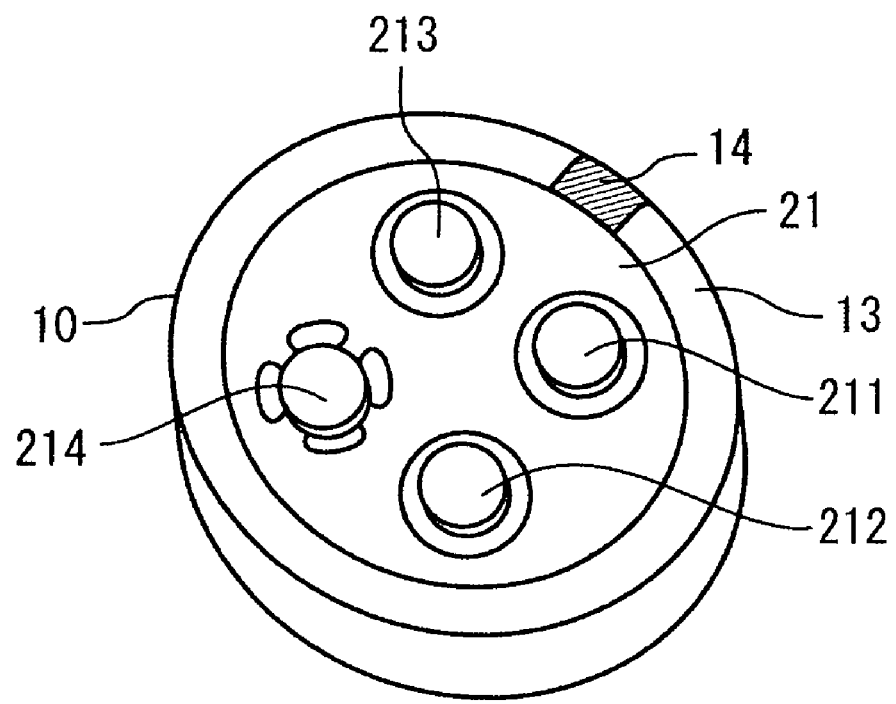
FIG. 7 shows a view illustrating an electronic device according to a fourth modified example and is a back-side perspective view of the same electronic device.

Next, with reference to FIG. 7, there will be described an electronic device according to a fourth modified example of the aforementioned embodiment. FIG. 7 is a back-side perspective view of the same electronic device. In the fourth modified example illustrated in the figure, the mounting orientation recognition mark hole 225 is eliminated and, instead thereof, a mounting orientation recognition mark 14 is provided on the crimped portion 13 of the case main body 10. Further, the other structures are completely the same as those in the aforementioned embodiment and, therefore, description and illustration thereof are omitted.

Namely, according to the fourth modified example, the ring-shaped crimped portion 13 is subjected to marking (matting) processing or primary processing (for reducing light reflection) to form the mounting orientation recognition mark 14 thereon. The arc-shaped holes 224 and the mounting orientation recognition mark 14 enable recognizing the orientation of the electronic device. It is possible to provide the mounting orientation recognition mark 14 during printing processing on the outer surface of the case main body 10 or the like. Further, there is no need for providing a specific space for forming the mounting orientation recognition mark, thereby offering the same effects as those of the aforementioned embodiment.

Further, in the fourth modified example, the position and the method at and with which the mounting orientation recognition mark 14 is provided on the crimped portion 14 of the case main body 10 are not limited. The shape, the number and the like of the arc-shaped holes 224 are not limited as a matter of course and, also, the arc-shaped holes 224 may be eliminated and the GND terminal 214 may be completely connected to the ground pattern 214.

The electronic devices according to the present invention can be applied not only to electret condenser microphones, as a matter of course, but also can be applied to any types of electronic devices provided with a plurality of input/output terminals on end surfaces thereof and having cross-sectional circular shapes or a polygon shapes. Also, the type, the shape, the placement, the number and the like of input/output terminals are not limited to those described in the aforementioned embodiment.

What is claimed is:

1. An electronic device provided with a plurality of input/output terminals on an end surface thereof and having a cross-sectional circular shape,
   characterized in that the electronic device comprises a substrate forming a portion of a housing and provided with said input/output terminals on a surface thereof,
   a ground pattern is formed on the surface of the substrate,
   portions of the ground pattern which are around the input/output terminals are removed to form contour removing holes, whereby the input/output terminals are surrounded by the ground pattern, and
   at least one of the contour removing holes is formed to have a shape different from shapes of the other contour removing holes, in order to utilize the contour removing holes as a whole as a mounting orientation recognition mark.

2. An electronic device according to claim 1, characterized in that
   the ground pattern is extended and connected to a GND terminal, and
   plural arc-shaped holes are formed in the ground pattern around the GND terminal such that the arc-shaped holes are circumferentially spaced apart from one another.

3. An electronic device according to claim 1, further comprising a case main body made of a metal,
   tip end portions of said input/output terminals being protruded trough an opening formed through an end surface of the case main body, characterized in that
   a peripheral edge of the opening of the case main body is inwardly folded and crimped over the entire periphery, and
   a mounting orientation recognition mark is provided on the crimped portion.

4. An electronic device according to claim 1, characterized in that said input/output terminals are formed from laminated metal thin layers made of the same material as that of the ground pattern.

5. An electronic device according to claim 1, further comprising a case main body made of a metal,
   tip end portions of said input/output terminals being protruded through an opening formed through an end surface of the case main body, characterized in that
   a peripheral edge of the opening of the case main body is inwardly folded and crimped over the entire periphery so as to be electrically connected to the ground pattern.

6. An electronic device provided with a plurality of input/output terminals on an end surface thereof and having a cross-sectional circular shape, characterized in that
   the electronic device comprises a substrate forming a portion of a housing and provided with said input/output terminals on a surface thereof,
   a ground pattern is formed on the surface of the substrate,
   the input/output terminals are surrounded by the ground pattern, and
   at least one of the input/output terminals is formed to have a cross-sectional shape different from a shape of the other input/output terminals, in order to utilize the input/output terminals as a whole as a mounting orientation recognition mark.

7. An electronic device according to claim 6, characterized in that
   the ground pattern is extended and connected to a GND terminal, and
   plural arc-shaped holes are formed in the ground pattern around the GND terminal such that the arc-shaped holes are circumferentially spaced apart from one another.

8. An electronic device according to claim 6, further comprising a case main body made of a metal,
   tip end portions of said input/output terminals being protruded through an opening formed through an end surface of the case main body, characterized in that
   a peripheral edge of the opening of the case main body is inwardly folded and crimped over the entire periphery, and
   a mounting orientation recognition mark is provided on the crimped portion.

9. An electronic device according to claim 6, characterized in that said input/output terminals are formed from laminated metal thin layers made of the same material as that of the ground pattern.

10. An electronic device according to claim 6, further comprising a case main body made of a metal,
    tip end portions of said input/output terminals being protruded through an opening formed through an end surface of the case main body, characterized in that a peripheral edge of the opening of the case main body is inwardly folded and crimped over the entire periphery so as to be electrically connected to the ground pattern.

11. An electronic device provided with a plurality of input/output terminals on an end surface thereof and having a cross-sectional circular shape, characterized in that the electronic device comprises a substrate forming a portion of a housing and provided with said input/output terminals on a surface thereof, a ground pattern is formed on the surface of the substrate, and the input/output terminals are surrounded by the ground pattern, and at least one of the input/output terminals is provided at an asymmetric position with respect to an axis, in order to utilize the input/output terminals as a whole as a mounting orientation recognition mark.

12. An electronic device according to claim 11, characterized in that the ground pattern is extended and connected to a GND terminal, and plural arc-shaped holes are formed in the ground pattern around the GND terminal such that the arc-shaped holes are circumferentially spaced apart from one another.

13. An electronic device according to claim 11, further comprising a case main body made of a metal, tip end portions of said input/output terminals being protruded through an opening formed through an end surface of the case main body, characterized in that a peripheral edge of the opening of the case main body is inwardly folded and crimped over the entire periphery, and a mounting orientation recognition mark is provided on the crimped portion.

14. An electronic device according to claim 11, characterized in that said input/output terminals are formed from laminated metal thin layers made of the same material as that of the ground pattern.

15. An electronic device according to claim 11, further comprising a case main body made of a metal, tip end portions of said input/output terminals being protruded trough an opening formed through an end surface of the case main body, characterized in that a peripheral edge of the opening of the case main body is inwardly folded and crimped over the entire periphery so as to be electrically connected to the ground pattern.

16. An electronic device according to claim 11, wherein the axis is defined by the circular shape.

17. An electronic device according to claim 11, wherein the axis is defined by the three of the input/output terminals.

18. An electronic device according to claim 11, wherein the asymmetric one of the terminals is at a different distance from the axis than the other terminals.

* * * * *